United States Patent [19]

Koike et al.

[11] 4,148,051
[45] Apr. 3, 1979

[54] SOLID-STATE IMAGING DEVICE

[75] Inventors: Norio Koike, Tokyo; Iwao Takemoto, Kodaira; Masaharu Kubo, Hachioji all of Japan

[73] Assignee: Hitachi, Ltd., Japan

[21] Appl. No.: 874,939

[22] Filed: Feb. 3, 1978

[30] Foreign Application Priority Data

Feb. 4, 1977 [JP] Japan .................. 52/10712

[51] Int. Cl.² .................................. H01L 27/14
[52] U.S. Cl. ............................... 357/30; 357/31; 357/24; 307/311
[58] Field of Search .............. 357/30, 31, 24, 41; 307/311

[56] References Cited

U.S. PATENT DOCUMENTS

| | | | |
|---|---|---|---|
| 3,676,715 | 7/1972 | Brodyr | 307/304 |
| 3,983,573 | 9/1976 | Ishihara | 357/24 |
| 4,012,587 | 3/1977 | Ochi | 358/213 |
| 4,067,046 | 1/1978 | Nakatani | 358/213 |
| 4,085,456 | 4/1978 | Tompsett | 365/114 |
| 4,090,212 | 5/1978 | Byatt | 357/24 |

Primary Examiner—Martin H. Edlow
Attorney, Agent, or Firm—Craig & Antonelli

[57] ABSTRACT

In a solid-state imaging device wherein at least one pn-junction photodiode and photo-signal detecting means adjacent thereto are disposed in a surface portion of a semiconductor substrate of one conductivity type, a solid-state imaging device characterized in that at least one window region is disposed within a semiconductor region which constitutes said photodiode and which has the opposite conductivity type to that of said semiconductor substrate, said window region "hollowing" said semiconductor region up to the surface of said semiconductor substrate and being made of a part of said semiconductor substrate.

14 Claims, 16 Drawing Figures

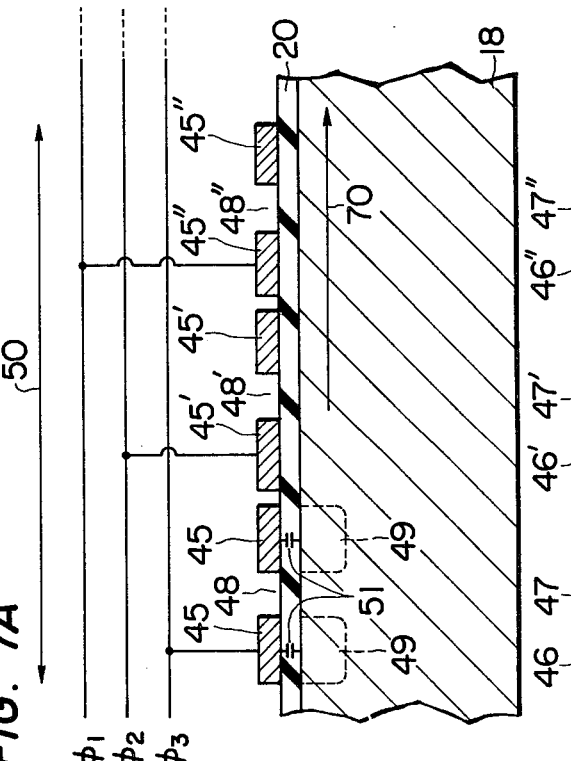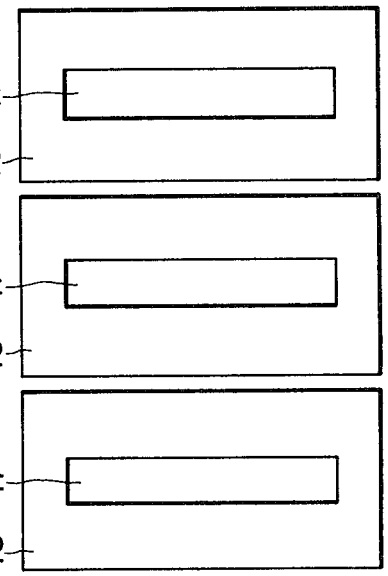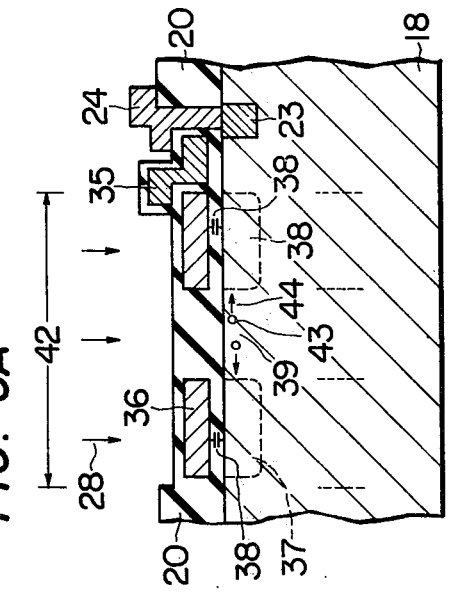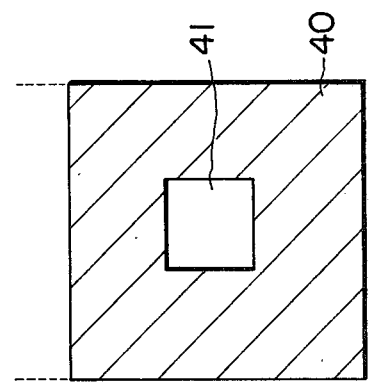

SOLID-STATE IMAGING DEVICE

BACKGROUND OF THE INVENTION (1) Field of the Invention:

This invention relates to a solid-state imaging device which has a plurality of picture elements disposed in a semiconductor surface region. More particularly, it relates to a solid-state imaging device which has picture elements for reading out from photodiodes photo information stored therein.

(2) Description of the Prior Art:

As a prior-art solid-state imaging device, there has been one as shown in FIG. 1.

FIG. 1 shows an example of construction of a typical areal solid-state imaging device. In this device, a photodiode 1 and an insulated-gate field effect transistor (shortly termed "MOS Tr") 2 make up a picture element as a unit. The array of the picture elements is selected by a horizontal scanning circuit (horizontal scanner) 9 and a vertical scanning circuit (vertical scanner) 10 which are made of MOS Tr type shift registers. Thus, MOS Tr's 3 and the MOS Tr's 2 are respectively turned "on" and scanned in sequence. By the scanning, charges having been generated by light as stored in the photodiodes 1 are led out from an output terminal 8 through signal lines 6 and 7, and video signals which the picture elements have received are taken out as electric signals. In FIG. 1, numeral 5 indicates a video power source. For some purposes, a plurality of signal lines 7 and output terminals 8 are disposed (for example, in case where the device is used in a color TV camera, the picture elements are allotted to respective color lights of the three primary colors, and signal lead-out lines for the respective primary color lights are disposed).

FIG. 2 shows the sectional structure of a typical picture element. Hereunder, for the sake of convenience of the description, an N-channel type solid-state imaging device in which the signal charges are electrons will be stated. However, the following explanation is quite similarly applicable to a P-channel type device by merely inverting the conductivity type and the polarity.

The pn-junction photodiode is formed of a silicon (Si) substrate 11 which is made of monocrystalline silicon of the p-type conductivity, and a diffusion layer of the n-type conductivity (n-type diffused layer) 12 which serves as a storage region for signal charges. The n-type diffused layer 12 simultaneously serves as a source, to form the insulated-gate field effect transistor (MOS Tr) serving as signal charge detection means along with a gate electrode 13 made of, e.g., polycrystalline silicon, a silicon dioxide ($SiO_2$) film 16 being thin under the gate electrode 13 and an n-type diffused layer 14 serving as a drain. The n-type diffused layer 14 is usually provided with an electrode 17 of a metal such as aluminum (Al) in order to lower the electric resistance thereof, and the electrode 17 is used as the signal line 6 in FIG. 1. The $SiO_2$ film 16 is ordinarily thickened outside the picture element in order to suppress the generation of an unnecessary stray capacitance.

Upon incidence of light 15, electron-hole pairs are generated in the n-type diffused layer 12 and the Si substrate 11. The electrons in the pairs flow into the n-type diffused layer 12 as the signal charges, and are stored in the pn-junction capacitance between the n-type diffused layer 12 and the Si substrate 11. The horizontal switching MOS Tr 3 is rendered conductive by a positive scan pulse from the horizontal scanner 9, and through the signal line 6 connected thereto, a video voltage from the video power source 5 is applied to the drains of the MOS Tr's 2 connected to the signal line 6. When a positive scan pulse from the vertical scanner 10 is simultaneously impressed on the gate electrode 13 of the MOS Tr 2, the signal charges (electrons) are drawn by and to the n-type diffused layer (drain) 14 held in a positive potential and are led to the output terminal 8 through the drain electrode 17.

The potential of the n-type diffused layer 12 consequently becomes a positive potential, which drops because the pn-junction capacitance continues to store electrons developed by the light 15 until the next positive scan pulse is impressed. Since the quantity of electrons stored corresponds to the quantity of light in the image of an object projected on the pn-junction photodiodes of the respective picture elements, the video signal can be taken out by the above operation.

Such a prior-art solid-state imaging device, especially the pn-junction photodiode being the heart thereof, structurally involves the disadvantage that the sensitivity to the visible light, especially short wavelength light, being the object of the image pickup is low. Accordingly, notwithstanding that a practical solid-state imaging device is eagerly desired, it is not yet realized.

The absorption of light by silicon differs depending on the wavelength. The absorption characteristics for lights of red (wavelength: 0.65 μm), green (0.55 μm) and blue (0.45 μm) constituting the three primary colors are illustrated as R, G and B in FIG. 3, respectively. The blue light at B creates electron-hole pairs in the vicinity of the surface of silicon, while the red light at R penetrates deep into silicon and creates electronhole pairs. In the n-type diffused layer near the surface of silicon, the probability at which the electron-hole pairs disappear due to the recombination is high, and the sensitivity lowers to that extent. As the result, the pn-junction photodiode employing silicon becomes highly sensitive to the red light (light of longer wavelength). According to a measurement by the inventor, even in case where the junction depth of the pn-junction photodiode is made as small as below 0.8 μm in order to enhance the sensitivity to the blue light, the sensitivity in blue is lower than the sensitivity for red.

In case of the color image pickup, accordingly, there occur such severe problems that the fidelity of color reproduction to the blue light becomes extremely inferior and that the signal-to-noise ratio is low. In effect, the color image pickup is impossible. Even in the black-and-white image pickup, a blue part in the image of an object becomes blackish, and a red part becomes whitish, so that the reproduced image becomes an unnatural one widely different from the image of the object. These drawbacks are great hindrances to the realization of the practical solid-state imaging device.

SUMMARY OF THE INVENTION

An object of this invention is to enhance the sensitivity of a solid-state imaging device to the visible light, especially the blue light, over great strides and to improve the fidelities of reproduction for the color and black-and-white image pickups.

In order to accomplish the aforecited object, this invention provides a solid-state imaging device having picture elements disposed in one principal surface of a semiconductor substrate of one conductivity type, said each picture element consisting of at least one pn-junction photodiode and photo-signal detection means adjacent thereto, characterized in that at least one window region is disposed within a semiconductor region (photo-signal charge storing region) which constitutes said photodiode and which has the opposite conductivity type to that of said semiconductor substrate, said window region hollowing said semiconductor region up to the surface of said semiconductor substrate and being made of a part of said semiconductor substrate, whereby charges generated in said window region by incident light, mainly charges generated in the vicinity of the substrate surface by the visible light of short wavelength such as blue light, are introduced into the photo-signal charge storing region around said window region so as to raise the sensitivity to the blue light.

BRIEF DESCRIPTION OF THE DRAWINGS

FIG. 6A is a sectional view showing the structure of a picture element in a solid-state imaging device of the third embodiment of this invention.

FIG. 6B is a view showing the plan layout pattern of a storage electrode in the picture element shown in FIG. 6A.

FIG. 7A is a sectional view showing the structure of a picture element in a solid-state imaging device of the fourth embodiment of this invention.

FIG. 7B is a view showing the plan layout pattern of storage electrodes in the picture element shown in FIG. 7A.

DESCRIPTION OF THE PREFERRED EMBODIMENTS

Figure 1:
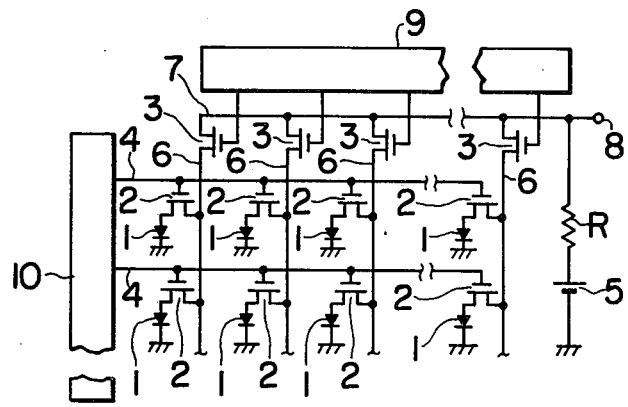
FIG. 1 is a view schematically showing the construction of a general solid-state imaging device.

Fundamentally, the solid-state imaging device of this invention has the construction illustrated in FIG. 1. That is, this invention adopts the construction wherein a large number of picture elements are integrated in a semiconductor substrate and wherein in order to select the picture elements and take out outputs, scanning circuits for selecting the (X, Y) coordinates of the picture elements are integrated in the same semiconductor substrate. Although FIG. 1 exemplifies the area sensor in which the picture elements are arrayed in two dimensions, this invention can of course be applied to a linear sensor. In case of the linear sensor, either the horizontal scanner or the vertical scanner suffices as the scanning circuit. Anyway, this invention concerns solid-state imaging devices, and improves the structure of the picture element in the prior-art solid-state imaging device.

In the solid-state imaging device of this invention, accordingly, various ones are employed as to the type of the scanning circuitry and the system for deriving signal outputs from the picture elements. By way of example, although in the device of FIG. 1 the signal line 6 is selected by turning the MOS FET 3 "on" and "off" by impressing the horizontal scanning pulse on the gate of the horizontal switching MOS Tr 3 from the horizontal scanner 9, it is sometimes executed to assemble a horizontal switching MOS FET in each picture element and to directly couple the signal lines 6 and 7. In some cases, a vertical switching MOS FET is disposed between the vertical scanning line 4 and the vertical scanner 10.

As the scanning circuits 9 and 10, ones disclosed in, e.g., S. G. Chamberlain, "Photosensitivity and Scanning of Silicon Image Detector Arrays," IEEE Journal of Solid State Circuits, vol. sc-4, No. 6, Dec. 1969 can be utilized for the solid-state imaging device of this invention.

In the ensuing explanation of embodiments, only the structure of the picture element will be referred to.

EMBODIMENT 1

Figure 2:
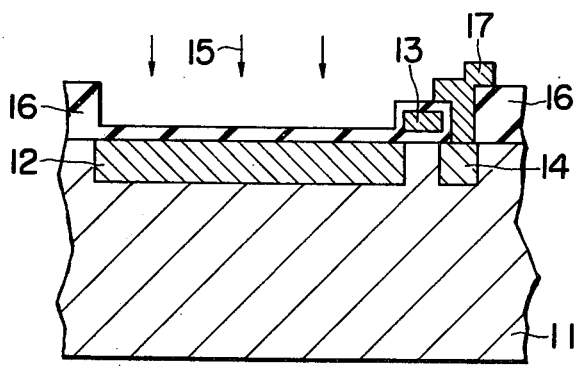
FIG. 2 is a sectional view showing the construction of a picture element in a prior-art solid-state imaging device.
Figure 3:
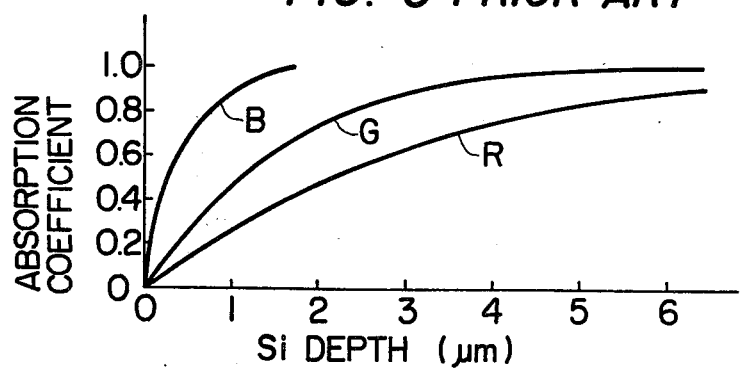
FIG. 3 is a graph showing the absorption characteristics of silicon (Si) for lights of the three primary colors.
Figure 4A:
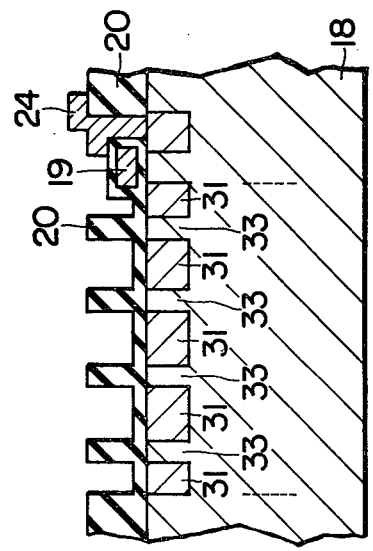
FIG. 4A is a sectional view showing the structure of a picture element in a solid-state imaging device of the first embodiment of this invention.
Figure 4B:
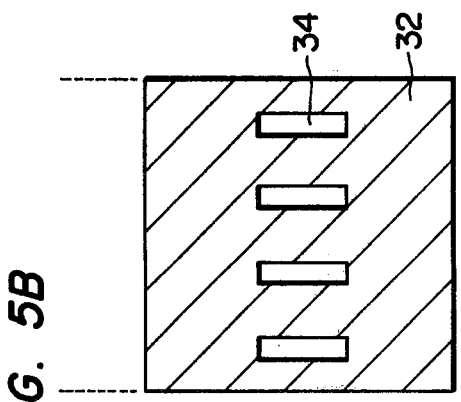
FIG. 4B is a view showing the plan layout pattern of a photodiode in the picture element shown in FIG. 4A.

FIGS. 4A and 4B are views showing the structure of a picture element essential to the device of this invention and the structure and plan pattern of a photodiode. In FIG. 4A, numeral 18 designates a p-type silicon (Si) substrate. Numeral 19 designates a gate electrode which is disposed on the Si substrate 18 through an insulating oxide film (in general, silicon dioxide ($SiO_2$) film) 20. Shown at 21 is an n-type diffused layer which serves as a storage region for signal charges, and which forms a pn-junction photodiode along with the substrate 18. The n-type diffused layer 21 simultaneously functions as the source of a MOS Tr as described with reference to FIG. 2. As illustrated by a plan layout pattern in FIG. 4B, the n-type diffused layer 21 has such a structure that the diffused layer is partly "hollowed out" by the substrate. A region 25 corresponds to the n-type diffused layer 21 shown in FIG. 4A, while a portion 26 corresponds to a hollowed region (22 in FIG. 4A), that is, a window in which the n-type diffused layer does not exist. Numeral 23 denotes the drain of the MOS Tr as made of an n-type diffused layer similar to that 21. The n-type diffused layer 23 is connected to a signal line 24 which is made of a metal (in general, aluminum (Al) is utilized).

When light 28 comes into incidence on a photodiode region 27, the region in which the n-type diffused layer 21 exists is highly sensitive to red light but is low in the sensitivity to blue light as has previously been stated. The sensitivity to blue is about 1/5 of the sensitivity to red. On the other hand, in the hollowed region 22 in which the n-type diffused layer 21 does not exist, charges 29 generated in the vicinity of the substrate surface by the blue light of large absorption coefficient get at the n-type diffused layer 21 arranged around the window by an electric field 30 which is established by the pn-junction photodiode.

Here, the plan shape of the hollowed region or window is arbitrary, and it may be a circle etc. besides the regular square illustrated. In order to effectively absorb the generated charges into the n-type diffused layer, it is efficient to select the size L of the window at approximately the diffusion length of the charges (electrons in this embodiment). The diffusion length in the Si substrate having a donor concentration of about $10^{15}/cm^3$ ordinarily used is about 20 μm. Therefore, in the present-time imaging devices in which the pitch of picture elements is about 50 μm, the size of the window may be selected at or below about 40 μm. In this case, a quantum efficiency of substantially 100% can be attained in the window region. Although the lower limit of the size of the window must be determined in dependence on the degree of improvement of the sensitivity to blue, it is 5 μm considering the present-time technology for fabricating the devices. If the processing technology develops in the future, it will be sufficiently possible to select the lower limit at about 1 μm. The reason why the insulating oxide film on the hollowed region 22 in which the n-type diffused layer 21 does not exist is thicker than that on the n-type diffused layer 21, is that the thicker area has been used as a diffusion mask at the time of forming the n-type diffused layer 21. Although the thicker film hardly affects the light absorption even when left as it is, the insulating oxide film on the region 22 may be made the same thickness as that of the insulating oxide film on the n-type diffused layer 21 after forming this layer 21. The flattened state is more suitable in case of forming color filters on the respective picture elements.

EMBODIMENT 2

Figure 5A:
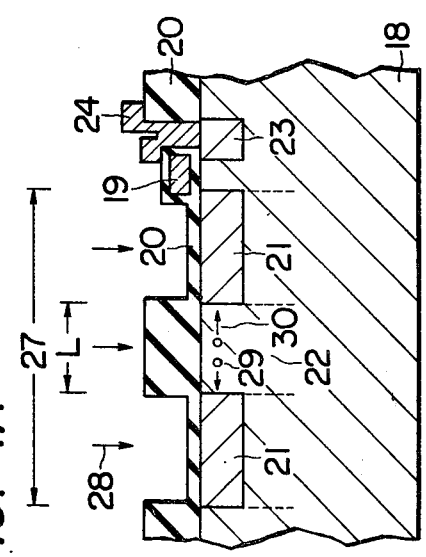
FIG. 5A is a sectional view showing the structure of a picture element in a solid-state imaging device of the second embodiment of this invention.
Figure 5B:
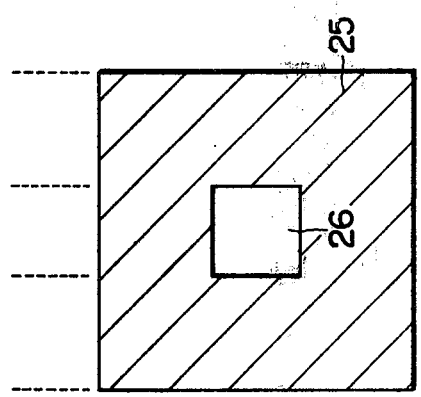
FIG. 5B is a view showing the plan layout pattern of a photodiode in the picture element shown in FIG. 5A.

Regarding the hollowed region or window stated previously, a plurality of portions may be disposed within the n-type diffused layer as illustrated in FIGS. 5A and 5B. In FIG. 5A, numeral 31 designates an n-type diffused layer which constitutes a photodiode. A region 32 in FIG. 5B corresponds to the n-type diffused layer 31 in FIG. 5A. Portions 33 (34 in FIG. 5B) are hollowed regions or windows which are disposed in an arbitrary number. In the present structure, even in case where the total area of the windows is designed to be equal to the area of the single window shown in FIGS. 4A and 4B and where the quantity of light falling on the windows is made equal to that in the preceding embodiment, the distance by which the generated charges travel to reach the n-type diffused layer being the photo-signal charge storing region becomes shorter, and hence, the charge loss at the time of the traveling can be prevented. Thus, the present structure can make the sensitivity to blue still higher than the structure illustrated in FIGS. 4A and 4B.

EMBODIMENT 3

Thus far, description has been made of the structure wherein the window is provided within the diffused layer for the diode in the pn-junction photodiode. It is also possible to provide a window in the photosensitive region of a MOS-structure type photosensor or a CCD-type photosensor in which charges generated in a predetermined region by light are stored as an inversion layer within a depletion layer formed under a storage-electrode for signal charges. FIGS. 6A and 6B are views showing the structure and plan layout pattern of a picture element in the solid-state imaging device employing the MOS-structure type photosensor according to this invention. In FIG. 6A, numeral 18 designates a p-type silicon (Si) substrate, and numeral 35 a gate electrode disposed through an insulating oxide film 20. Shown at 36 is an electrode for storing signal charges, the central part 39 of which is hollowed out. As the signal charge storing electrode 36, there is ordinarily used a polycrystalline silicon film which is electrically conductive and light-permeable (film thickness: 3,000 Å–4,000 Å). A predetermined voltage is applied to the electrode 36 (means therefor is not illustrated), and a depletion layer 37 is formed in the semiconductor surface underneath the electrode and serves as a storage region for photo-signal charges. Charges generated by incident light are stored in a capacitance 38 which the electrode 36 forms through the oxide film 20. In FIG. 6B, a region 40 corresponds to the photo-signal charge storing electrode 36, and a portion 41 corresponds to the hollowed region or window 39 of the electrode 36.

When light 28 comes into incidence on a photodiode region 42, the sensitivity to blue is high in the window region 39 due to the same operation as explained with reference to FIG. 4, and generated charges 43 flow towards the depletion layer region of lower potential serving as the storage region for the photo-signal charges (as indicated by arrow 44). When a positive scanning pulse is impressed on the gate electrode 35 constructing signal charge detection means, the charges stored under the electrode 36 are drawn out to an n-type diffused layer for a drain 23 and are led to an output line 24.

EMBODIMENT 4

FIGS. 7A and 7B are views showing the structure and layout pattern of a picture element in the solid-state imaging device employing CCD's (charge coupled devices) according to this invention. In FIG. 7A, numeral 18 designates a p-type semiconductor substrate, and numerals 45, 45' and 45" electrodes which are disposed through an insulating oxide film 20 and which have the function of storing photo-signal charges. In the layout pattern of the electrodes 45, 45' and 45" in FIG. 7B, regions 46, 46' and 46" correspond to the electrodes 45, 45' and 45" respectively, and portions 47, 47' and 47" correspond to hollowed regions 48, 48' and 48" (in FIG. 7A) of the electrodes 45, 45' and 45" respectively.

All the electrodes 45, 45' and 45" are of the hollowed structure. Assuming now that the electrodes 45' and 45" are held at the zero V and that a predetermined voltage is applied to the electrode 45 (ordinary shift pulses are impressed by signal lines $\phi_1$, $\phi_2$ and $\phi_3$), a depletion layer 49 as a storage region for photo-signal charges is formed underneath the electrode 45. Light incident on a picture element 50 generates charges within the Si substrate 18, and the generated charges are stored in the depletion layer 49 by the same operation as in the case of Embodiment 3. When the electrode 45 becomes the zero V and simultaneously the predetermined voltage is applied to the adjacent electrode 45', the charges stored in an electrode capacitance 51 shift to a depletion layer formed under the next electrode 45'. Thereafter, in conformity with the charge transfer mechanism of the conventional CCD, the charges are sequentially transferred (in the direction of arrow 70), and they are read out by signal charge detection means (not shown) disposed at the final stage of the imaging device.

EMBODIMENT 5

The manufacturing process of the solid-state imaging device with the structure of the present embodiment will be described with reference to FIGS. 8A–8E. The manufacturing method is one in the case of adopting the LOCOS (local oxidation of silicon) process which is especially high in the density of integration among the manufacturing techniques of MOS Tr's. It is to be noted that the device of this invention is not restricted to the particular method of manufacture. For the sake of convenience of the explanation, the manufacturing steps of only the portion of the picture element are illustrated.

Figure 8A:
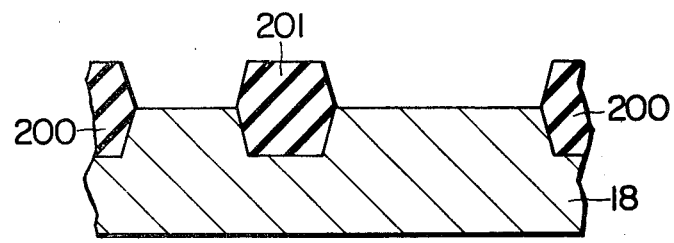
FIG. 8A-8E are a series of sectional views for explaining the structure of a picture element in a solid-state imaging device of the fifth embodiment of this invention in the order of manufacturing steps.

(i) A first oxide (SiO$_2$) film at 200 and 201 is formed on an Si substrate of the p-type conductivity 18 (acceptor concentration N$_a$ ≃10$^{15}$/cm$^3$) by the LOCOS process (FIG. 8A).

Figure 8B:
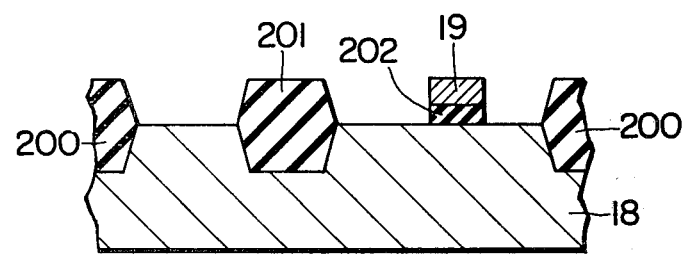

(ii) An oxide (SiO$_2$) film for a gate, 202 is formed by the thermal oxidation, and a polycrystalline silicon layer 19 for a gate electrode is deposited thereon by, for example, the CVD (chemical vapor deposition) process. Further, the polycrystalline silicon layer other than a portion corresponding to a gate region is removed by the photoetching method, and using the resultant gate electrode as a mask, the gate oxide film outside the gate electrode is removed by etching (FIG. 8B).

Figure 8C:
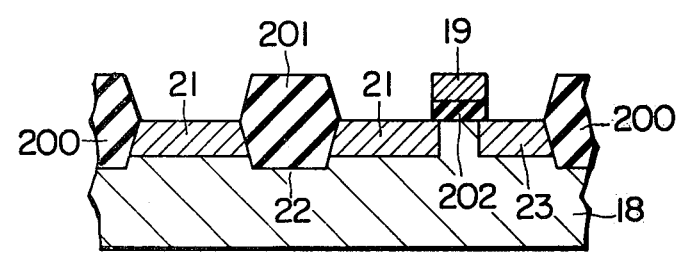
Figure 8D:
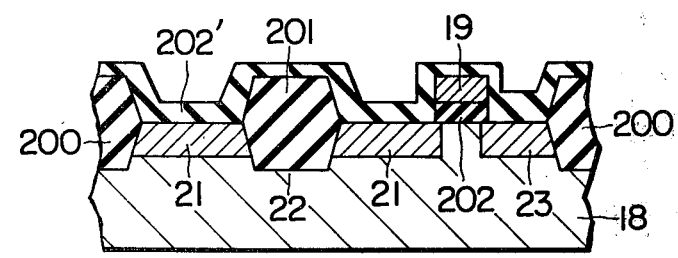

(iii) An impurity (e.g., phosphorus) of the conductivity type opposite to that of the substrate is diffused by the thermal diffusion, to form a drain 21 and a source 23 (donor impurity concentration N$_d$ ≃10$^{20}$/cm$^3$). The hollowed region 22 is formed under the first oxide film 201 in the picture element of this embodiment. The impurity simultaneously diffuses into the polycrystalline silicon layer for the gate, to raise the conductivity of the polycrystalline silicon layer. Thereafter, a second oxide (SiO$_2$) film 202' is formed over the entire surface (FIGS. 8C and 8D).

Figure 8E:
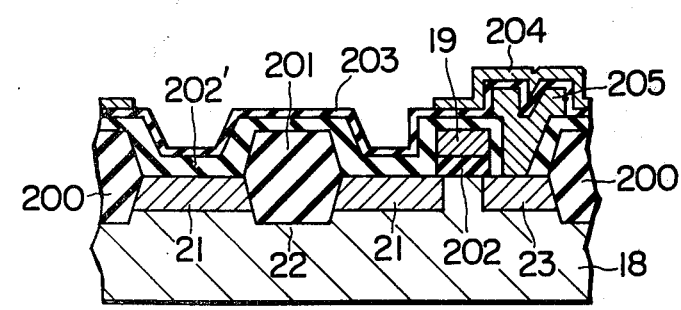

(iv) The second oxide films overlying the drain are removed by the photoetching, and an Al film is deposited over the entire surface by evaporation. Thereafter, the Al except for a wiring portion for signal output 205 is removed by the photoetching (FIG. 8E).

(v) The third oxide film (of, e.g., SiO$_2$) 203 is formed over the entire surface.

An Al film 204 is deposited over the entire surface by evaporation. Thereafter, the Al over a photodiode portion is removed by the photoetching. Then, the fabrication of the device is completed (FIG. 8E).

Scanning circuits arranged in the peripheral part with respect to the picture elements are also fabricated by the steps illustrated in FIGS. 8A–8E (the illustration has been omitted).

Although, in the foregoing description, the semiconductor region which constitutes the pn-junction photodiode and which has the opposite conductivity type to that of the semiconductor substrate has been termed the diffused layer, it may of course be formed by the ion implantation process etc. The method for producing the foregoing structures does not differ from the fabricating process for conventional MOS type integrated circuits.

As described in detail in conjunction with the embodiments, by disposing or providing the window which is such that the pn-junction photodiode for photoelectric transduction in the solid-state imaging device is hollowed out, the blue sensitivity of the photosensor is remarkably enhanced. According to the result of an experiment by the inventors, the blue sensitivity has increased to two to four times by appropriately setting the ratio between the area of the hollowed region in this invention and the total area of the photodiode. Consequently, owing to the photosensor of this invention, the blue sensitivity which has been an important problem in the prior-art imaging devices can be improved, and the picture quality of, not only a color imaging device, but also a black-and-white imaging device can be sharply improved.

As set forth above in detail in connection with the embodiments, the window which is such that the photodiode, the storage electrode or the CCD electrode for the photoelectric transduction of the solid-state imaging device is partly hollowed out is provided, whereby the sensitivity to blue is remarkably enhanced. According to this invention, therefore, the blue sensitivity which has been the serious problem in the prior-art imaging devices can be improved, and the picture quality of, not only a color imaging device, but also a black-and-white imaging device can be sharply improved.

Although, in the foregoing description, the photodiode, the CCD, etc. have been exemplified as the constituent unit of the imaging device, the use of charge injection devices, bipolar phototransistors, Shottkey photodiodes, etc. can be considered within a scope not departing from the subject matter of this invention.

What is claimed is:

1. A solid-state imaging device comprising a semiconductor substrate of a first conductivity type and a plurality of picture elements disposed in a surface portion of said semiconductor substrate, said picture element being comprised of:
   (i) a picture element region disposed in said surface portion and provided so as to be isolated from other picture elements;
   (ii) a first region of a second conductivity type opposite to said first conductivity type disposed in said picture element region, and constituting a pn-junction diode together with said semiconductor substrate;
   (iii) a window region of said first conductivity type disposed in said first region and hollowing said first region therethrough; and
   (iv) detective means for detecting signal charges stored in said first region.

2. A solid-state imaging device according to claim 1, wherein said window region is a projection of said semiconductor substrate.

3. A solid-state imaging device according to claim 1, wherein said window region is a throughhole disposed in said first region.

4. A solid-state imaging device according to claim 1, further comprising a scanning circuit provided in said semiconductor substrate and arranged in the peripheral part with respect to said picture elements.

5. A solid-state imaging device according to claim 1, wherein a width of said window region is as small as a diffusion length of signal charges in said semiconductor substrate or less.

6. A solid-state imaging device according to claim 1, wherein said picture element has a plurality of said windows in said first region.

7. A solid-state imaging device according to claim 1, wherein said detective means includes
   (i) a second region of a second conductivity type disposed in said picture element region,
   (ii) a gate insulating film provided so as to cover a region lying between said first region and said second region, and
   (iii) a gate electrode disposed on said gate insulating film.

8. A solid-state imaging device comprising a semiconductor substrate of a first conductivity type having a major surface and a plurality of picture elements disposed in a surface portion of said semiconductor substrate, said picture element being comprised of;
   (i) a transparent insulating film which is disposed on said major surface so as to cover a photosensitive region in said picture element;

(ii) a transparent gate electrode which is disposed on said transparent insulating film, and is supplied with a predetermined voltage;
(iii) a window hollowing said transparent gate electrode therethrough; and
(iv) detective means for detecting signal charges stored in said photosensitive region.

9. A solid-state imaging device according to claim 8, wherein there are a plurality of said transparent electrodes having said windows in each of them in said picture element.

10. A solid-state imaging device according to claim 8, wherein said detective means includes
(i) an insulating film with is desposed on said major surface so as to cover a transferring region adjacent to said photosensitive region, and
(ii) at least one transfer-gate electrode which is desposed on said insulating film.

11. A solid-state imaging device according to claim 10, wherein said detective means further includes
(iii) a detective region of said second conductivity type disposed adjacent to said transferring region.

12. A solid state imaging device according to claim 10, wherein said transfer-gate electrode is disposed adjacent to a transparent gate electrode of another picture element.

13. A solid-state imaging device according to claim 7, wherein said detective means further includes means for supplying a video voltage which has a predetermined voltage value to said second region.

14. A solid-state imaging device according to claim 13, wherein said detective means further includes a detective electrode disposed on said second region, and wherein said video voltage is supplied to said detective electrode.

* * * * *